(12) United States Patent
Nickerson et al.

(10) Patent No.: US 11,031,774 B2
(45) Date of Patent: Jun. 8, 2021

(54) SUPERCONDUCTING FAULT CURRENT LIMITER HAVING IMPROVED ENERGY HANDLING

(71) Applicant: Varian Semiconductor Equipment Associates, Inc., Gloucester, MA (US)

(72) Inventors: Scott W. Nickerson, Plaistow, NH (US); Paul Murphy, Reading, MA (US); Saeed Jazebi, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 251 days.

(21) Appl. No.: 16/245,993

(22) Filed: Jan. 11, 2019

(65) Prior Publication Data

US 2019/0229528 A1 Jul. 25, 2019

Related U.S. Application Data

(60) Provisional application No. 62/619,421, filed on Jan. 19, 2018.

(51) Int. Cl.
*H02H 9/02* (2006.01)
*H01B 12/02* (2006.01)
*H01L 39/16* (2006.01)

(52) U.S. Cl.
CPC ............ *H02H 9/023* (2013.01); *H01B 12/02* (2013.01); *H01L 39/16* (2013.01)

(58) Field of Classification Search
CPC ........ H02H 9/023; H02B 12/02; H02B 12/06; H01B 12/00; H01L 38/16
See application file for complete search history.

(56) References Cited

U.S. PATENT DOCUMENTS

| | | | |
|---|---|---|---|
| 4,961,066 A | 10/1990 | Bergsjo et al. | |
| 5,219,827 A * | 6/1993 | Higaki | H01P 7/082 333/219 |
| 2012/0275067 A1* | 11/2012 | Tekletsadik | H01L 39/16 361/19 |
| 2015/0348680 A1* | 12/2015 | Wang | H01L 39/2464 505/230 |
| 2015/0348682 A1* | 12/2015 | Wang | H01B 13/30 505/237 |
| 2016/0163424 A1* | 6/2016 | Wang | H01L 39/16 505/230 |
| 2016/0344113 A1 | 11/2016 | Fersan | |

(Continued)

FOREIGN PATENT DOCUMENTS

| JP | 02281765 A | 11/1990 |
|---|---|---|
| JP | 05251756 A | 11/1990 |

(Continued)

OTHER PUBLICATIONS

International Search Report and Written Opinion dated Apr. 23, 2019 for PCT/US2019/014006 filed Jan. 17, 2019.

*Primary Examiner* — Adolf D Berhane
(74) *Attorney, Agent, or Firm* — Kacvinsky Daisak Bluni PLLC

(57) ABSTRACT

A superconducting fault current limiter element, comprising: a plurality of tapes, arranged in electrical parallel fashion among one another, wherein at least one tape of the plurality of tapes comprises a superconductor tape, and wherein at least one tape of the plurality of tapes comprises a non-superconductor tape.

20 Claims, 5 Drawing Sheets

(56) References Cited

U.S. PATENT DOCUMENTS

| | | | | |
|---|---|---|---|---|
| 2018/0219372 A1* | 8/2018 | Nickerson | ................ | H02H 9/02 |
| 2019/0058318 A1* | 2/2019 | Jazebi | .................... | H02H 7/008 |
| 2019/0260202 A1* | 8/2019 | Hoffmann | ................ | H01F 6/06 |

FOREIGN PATENT DOCUMENTS

| | | | |
|---|---|---|---|
| JP | 02281765 A | 9/1993 | |
| JP | 05251756 A | 9/1993 | |

* cited by examiner

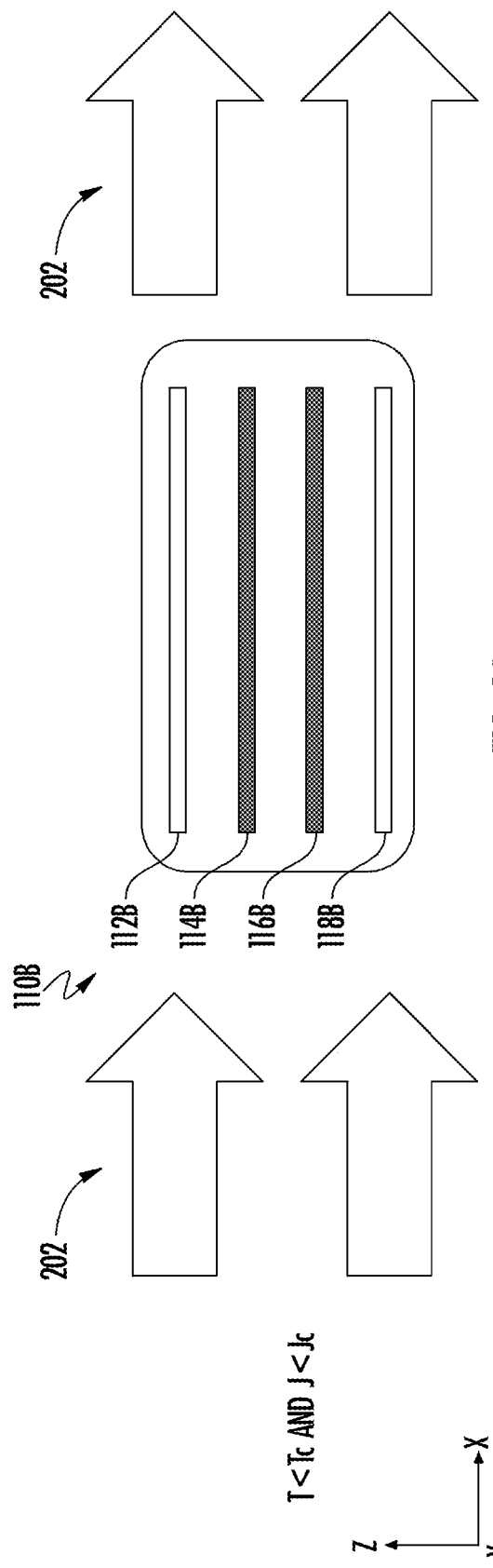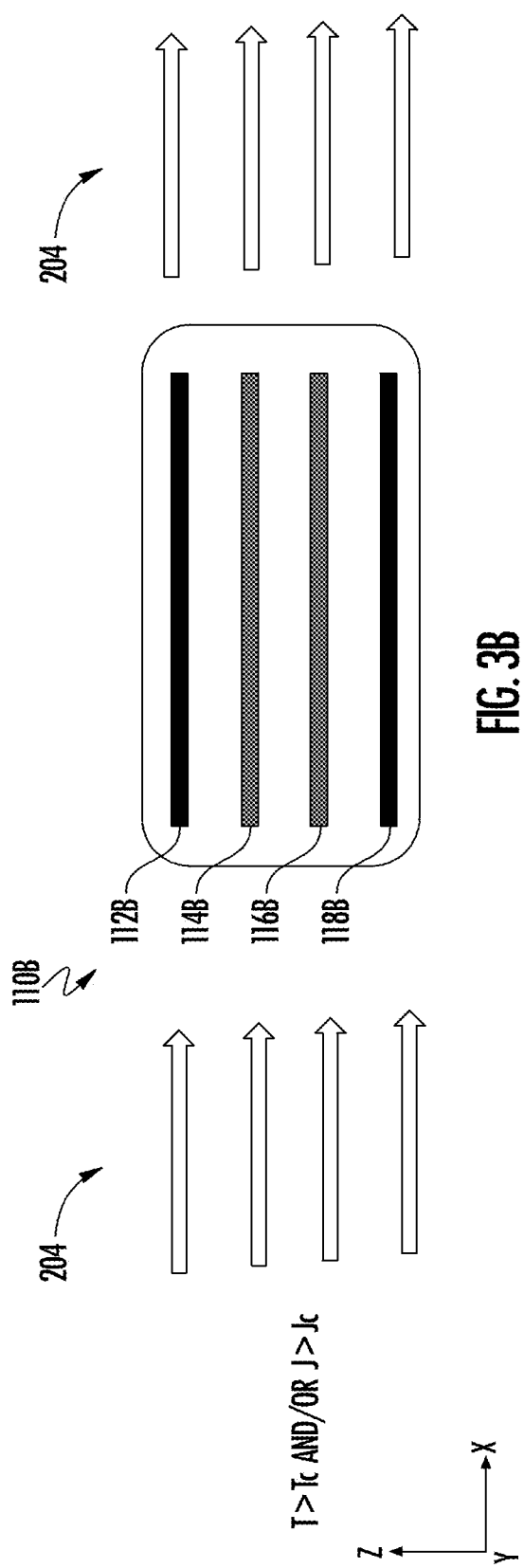

SUPERCONDUCTING FAULT CURRENT LIMITER HAVING IMPROVED ENERGY HANDLING

RELATED APPLICATIONS

This application claims priority to U.S. Provisional Patent application 62/619,421, filed Jan. 19, 2018, entitled SUPERCONDUCTING FAULT CURRENT LIMITER HAVING IMPROVED ENERGY HANDLING, and incorporated by reference herein in its entirety.

FIELD

This disclosure relates to current protection devices, to a superconducting fault current limiter module, and more particularly to structure of a superconducting element.

BACKGROUND

A fault current limiter (FCL) is a device for limiting fault currents, such as in a power system. Various types of FCLs have been developed over the last several decades, including superconducting fault current limiters (SCFCLs).

A fault current is an abnormal current in an electrical system resulting from a fault in the system, such as a short circuit. A fault current may arise in a system due to any number of events or failures, such as power lines or other system components being damaged by severe weather (e.g. lightning strikes). When such a fault occurs, a large current (a fault current) can quickly appear in the circuit as the current is no-longer limited by load. This surge of current is undesirable because of potential damage to the load, including the network itself, or equipment connected to the network.

In known SCFCL systems, a superconductor fault current limiter, having at least one fault current limiter module, acts to conduct electric current without resistance up to a maximum or trigger current. During a fault condition, excessive fault current may exceed the trigger current and cause the superconductor material in a superconductor fault current limiter to warm up and quench, and enter a normal conduction state. Current may then be conducted to a limited extent through the normal state conducting material of the SCFCL. The fault condition may additionally generate excess energy, some dissipated as heat in the SCFCL system. In existing SCFCL systems the ability to handle energy produced during a fault may be limited by the design of superconducting modules. A given superconducting element or module may have a given thermal mass to be used to handle a given amount of energy. By increasing the number of parallel superconductor tapes, the thermal mass and the energy handling can be increased. This increase in parallel superconductor elements also has the effect of increasing the trigger current level where the module or element quenches. The higher trigger current level may be undesirable, depending upon the system requirements of the system being protected by the SCFCL, while a minimum thermal/energy handing performance may be needed.

With respect to these and other considerations the present disclosure is provided.

BRIEF SUMMARY

In one embodiment, a superconducting fault current limiter element, is provided. The superconducting fault current limiter element may include a plurality of tapes, arranged in electrical parallel fashion among one another, wherein at least one tape of the plurality of tapes comprises a superconductor tape, and wherein at least one tape of the plurality of tapes comprises a non-superconductor tape.

In another embodiment, a superconducting fault current limiter system may include a superconducting fault current limiter, an input conductor, coupled to the superconducting fault current limiter on a first side, and an output conductor, coupled to the superconducting fault current limiter on a second side, and arranged in electrical series with the input conductor and the output conductor. The superconducting fault current limiter may include a plurality of superconducting fault current limiter elements, wherein a given superconducting fault current limiter element comprises a plurality of tapes, arranged in electrical parallel fashion among one another. At least one tape of the plurality of tapes may comprise a superconductor tape, wherein at least one tape of the plurality of tapes comprises a non-superconductor tape.

In another embodiment, a method may include providing a superconducting fault current limiter, the superconducting fault current limiter comprising a plurality of tapes, including at least one non-superconductor tape and at least one superconductor tape. The method may include conducting a current through the superconducting fault current limiter a first current level, wherein the first current level is below a critical current for the at least one superconductor tape. The method may further include limiting the current passing through the superconducting fault current limiter during a fault event, wherein the at least one superconductor tape becomes non-superconducting, and dissipating an energy of the fault event through the plurality of tapes, including the at least one non-superconductor tape.

BRIEF DESCRIPTION OF THE DRAWINGS

The accompanying drawings illustrate exemplary approaches of the disclosure, including the practical application of the principles thereof, as follows:

FIG. 3A depicts one mode of operation a superconductor tape, according to embodiments of the disclosure;

FIG. 3B depicts one mode of operation a superconductor tape, according to embodiments of the disclosure.

Figure 1A:
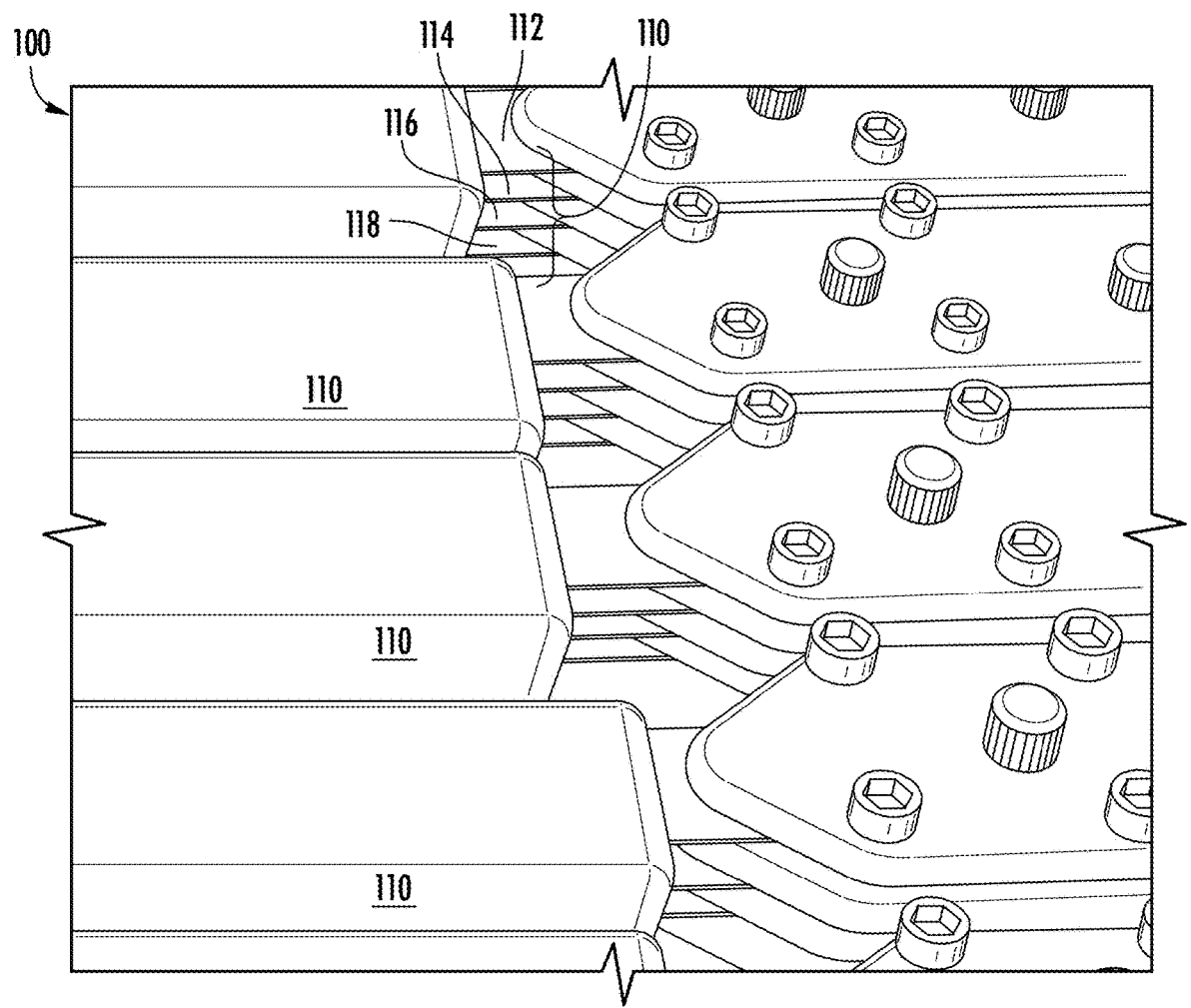
FIG. 1A depicts a perspective view of a superconducting fault current limiter module in accordance with embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, references to "one embodiment" or "some embodiments" of the present disclosure may be interpreted as including the existence of additional embodiments also incorporating the recited features.

Figure 1B:
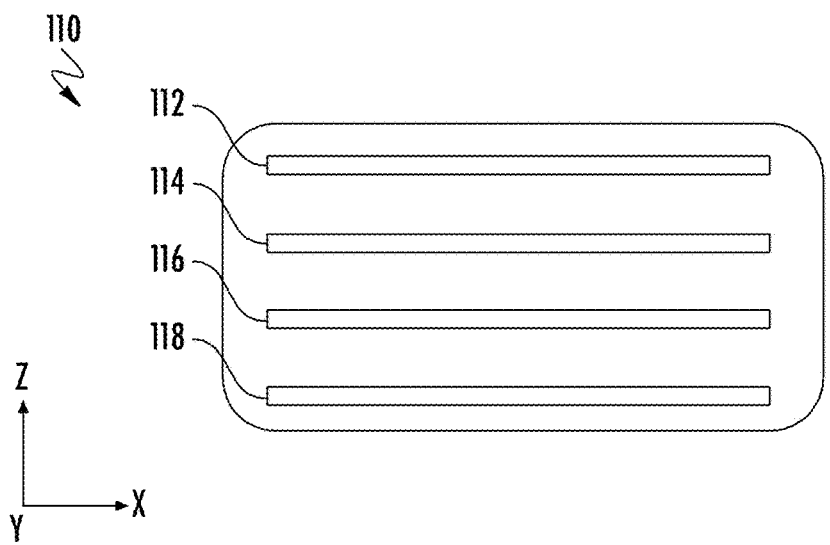
FIG. 1B depicts a side cross-sectional view of a portion of the superconducting fault current limiter module of FIG. 1A.

The present embodiments provide a SCFCL for use in overcurrent events such as in a fault current. FIG. 1A shows a perspective view of a superconductor fault current limiter module, referred to herein as array 100. Array 100 may represent a portion of a superconductor fault current limiter, or a portion of a superconductor fault current limiter module, where the superconductor fault current limiter may include a plurality of superconductor fault current limiter arrays. As depicted in the side view of FIG. 1B, the array 100 may be arranged as a series of parallel superconductor tapes, where a given superconductor tape is arranged in a zig zag pattern of parallel lines, where adjacent lines are connected on alternating ends, as shown. Turning to FIG. 1B, where one element is shown, a given element, shown as a superconducting fault current limiter element 110, includes four parallel tape structures (or tape segments), shown as tape structure 112, tape structure 114, tape structure 116, and tape structure 118.

Generally, an element of a superconductor fault current limiter may refer to an array of superconductor tapes, arranged in parallel fashion, such as a vertical array of superconductor tapes, or may refer to an array of portions of superconductor tapes, such as tape segments or tape structures, again arranged in electrically parallel fashion. Thus, the tape structures of a tape element may be arranged in electrical parallel fashion to one another, and may be stacked on top of one another, as shown. A given tape may be formed from a group of tape structures (arranged as tape segments) on a given level (see FIG. 1B, showing four different levels), arranged in electrical series with one another in any convenient fashion. As a whole, the current carrying capability of an array 100, or a complete SCFCL may be determined by the number of electrically parallel superconductor tapes. Thus, for configurations having four tapes, there may be a pair of outer tapes and a pair of inner tapes.

By way of background, in known SCFCL systems, each of the tape structures, such as tape structure 112, tape structure 114, tape structure 116, and tape structure 118, are arranged in a given level to form superconductor tapes. Such superconductor tapes are arranged as laminated structures including a superconductor layer and normal conductor layer(s) within a given tape.

Figure 1C:
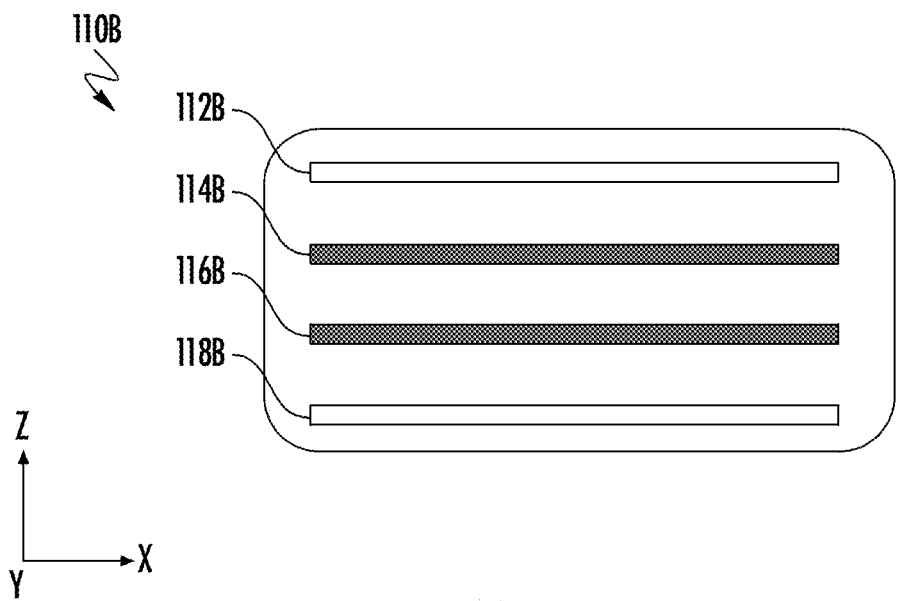
FIG. 1C illustrates a specific embodiment of a superconducting fault current limiter element according to embodiments of the disclosure.
Figure 1D:
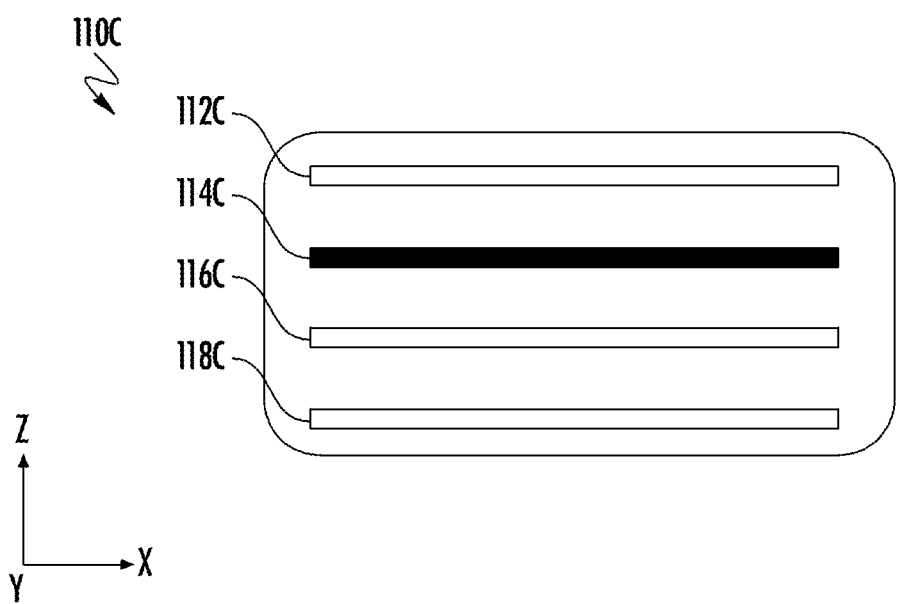
FIG. 1D illustrates a specific embodiment of a superconducting fault current limiter superconducting fault current limiter element according of the disclosure.

In accordance with the embodiments of this disclosure at least one of the tape structures of the superconducting fault current limiter element 110 is a conductive structure, arranged with no superconductor layer. In one exemplary embodiment, the tape structure 112 and tape structure 118 are arranged in all the superconducting fault current limiter elements 110 of their respective levels as superconductor tape structures, to form superconductor tapes. At the same time, the tape structure 114 and tape structure 116 are arranged in all the superconducting fault current limiter elements 110 in their respective levels as non-superconductor tape structures, to form non-superconductor tapes within their given levels. In other embodiments, a non-superconductor tape is formed in just the level of the tape structure 114, or just the level of the tape structure 116, while superconductor tapes are formed in the other levels. FIG. 1C illustrates a specific embodiment of a superconducting fault current limiter element 110B, where the tape structure 114B and tape structure 116B are non-superconductor tapes, while the tape structure 118B, and tape structure 112B are superconductor tapes. FIG. 1D illustrates a specific embodiment of a superconducting fault current limiter superconducting fault current limiter element 110C, where the tape structure 114B is a non-superconductor tape, while the tape structure 116B, tape structure 118B, and tape structure 112B are superconductor tapes.

In other embodiments a superconducting fault current limiter element may include fewer levels, such as three levels, having three parallel tapes, or a greater number of levels, such as five levels, six levels, and so forth, where at least one tape in a first level is a superconductor tape, and at least one tape, in a second level is a non-superconductor tape.

According to some embodiments, a non-superconductor tape has the same general layer configuration as a superconductor tape, minus the superconductor layer. As an example, the tape structure 116 may include a base stainless steel layer and a top silver layer, lacking a superconductor layer between the top silver layer and base stainless steel layer. In other embodiments a tape structure may include any appropriate material, and may differ in the metallic materials and structure of the superconductor tapes, while generally being an electrical conductor, such as a metallic tape.

During normal operation of the array 100, electrical current passes through the superconductor tapes of the superconducting fault current limiter element 110, while the superconductor tapes are in a superconducting state. Non-superconductor structures, such as tape structure 114, for example, are "invisible" in that the electrical current is funneled through the superconductor structures, such as tape structure 112 and tape structure 118, since current passes without resistance through the latter structures. During a quench, such as caused by a fault current, the tape structure 112 and tape structure 118 become normal state conductors having finite electrical resistance, and the tape structure 114 "appears," meaning the tape structure 114 also presents an electrically conductive path, comparable to the electrical resistance of the tape structure 118 and tape structure 112, and may assist in the energy handling during the quench state.

Consistent with the general structure of the array 100, in various embodiments, the number and the relative position of superconductor tapes and non-superconductor tapes, arranged in electrically parallel fashion to one another, may be tailored to improve performance of a system. Advantages of the present embodiments include the ability to increase energy handling capability for a SCFCL while not having to increase the trigger current, since the energy handling may be increased by the use of non-superconductor tapes, while not changing the trigger current where the SCFCL quenches. Additionally, higher critical current tapes may be used to construct an element, while lesser in number, since additional tape structures may be non-superconductors. This arrangement serves to reduce cost compared to known systems using a greater number of superconductor tapes having less current capability. Because the number of non-superconductor tape structures may be added in a modular fashion, the relative ratio of superconductor tapes to non-superconductor tapes may be varied in a granular fashion in different embodiments, to achieve a fine level of control of the current capacity as well as energy handling of a SCFCL during quench.

Figure 2:
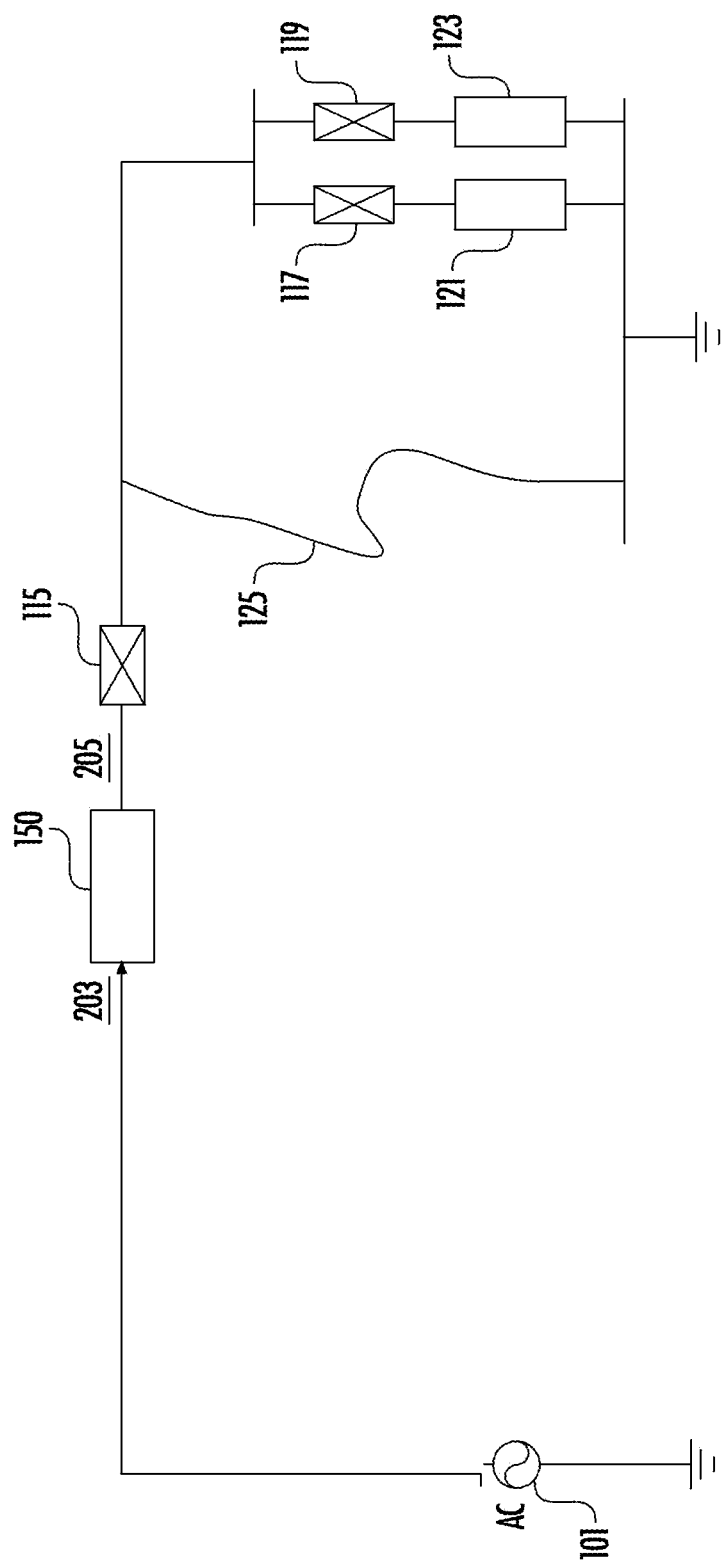
FIG. 2 depicts a superconductor fault current limiter in accordance with embodiments of the disclosure.

FIG. 2 shows an implementation of a fault current limiter system 150, according to embodiments of the disclosure. The fault current limiter system 150 may include a superconductor fault current limiter and current protection device, as discussed above. A power source 101 may supply power to the fault current limiter system 150. Fault current limiter system 150 may be coupled through breaker 115, such as a circuit breaker, and matching circuits 117 and 119 to electrical load 121 and electrical loads 123. Additional loads and matching circuits may be provided in other embodiments. A short circuit fault 125 may exist and, if present, will be isolated by operation of various embodiments described herein. Thus, the fault current limiter system 150 can be electrically connected in series to a power source 101 and one or more electrical loads via input conductor 203 and output conductor 205.

FIG. 3A depicts one mode of operation of the superconducting fault current limiter element 110B, where the operating conditions are such that the current (or current density) (J) passing through the superconducting fault current limiter element 110B is below the critical current (Jc) and the temperature of the superconducting fault current limiter element 110B is below the critical temperature (Tc) for transition between superconducting state and non-superconducting state. Under these conditions, the current J (represented by current arrows 202) may have a relatively large value, where nearly all current passes through the tape structure 112B and the tape structure 118B. The tape structure 114B and the tape structure 116B are normal state conductors, indicated by the dark shading, presenting a finite resistance, such that nearly all the current J is diverted through the tape structure 118B and tape structure 112B.

FIG. 3B depicts another mode of operation of the superconducting fault current limiter element 110B. In this mode the operating conditions are such that the current (or current density) (J) passing through the superconducting fault current limiter element 110B is above the critical current (Jc) and/or the temperature of the superconducting fault current limiter element 110B is above the critical temperature (Tc) for transition between superconducting state and non-superconducting state. Under these conditions, characteristic of a fault event, where a surge of current may exceed Jc and also cause a temporary heating of the tape superconducting fault current limiter element above Tc, the tape structure 114B and the tape structure 116B are normal state conductors. In addition, the tape structure 112B and the tape structure 118B are now transformed into normal state conductors, where all the tape structures not present finite resistance, limiting the current J (shown by current arrows 204) to a much lower value, where a portion of current may pass through each of the superconductor tape structures.

Thus, the configuration of superconducting fault current limiter element 110B in FIG. 3A and FIG. 3B limits the total current before quenching to non-superconductor state, because just two tape structures are superconductor tapes, while providing similar thermal handling capability to a configuration having four parallel superconductor tape structures.

Figure 4:
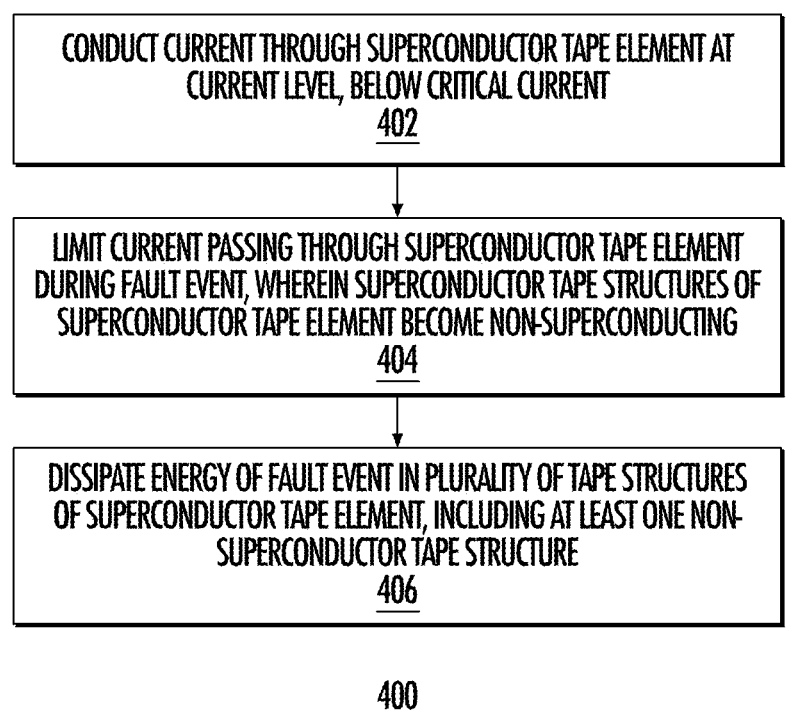
FIG. 4 depicts an exemplary process flow.

FIG. 4 depicts a process flow 400, according to embodiments of the disclosure. At block 402, current is conducted through a superconductor tape element at a current level below the critical current of the superconductor tape. The superconductor tape element includes a plurality of tape structures, arranged in electrically parallel fashion, where at least one tape structure is a non-superconductor tape structure.

At block 404, the current level is limited for current passing through the superconductor tape element during a fault event. As such, the fault event triggers the plurality of tape structures of the superconductor tape element to become non-superconducting. At block 406, the energy of the fault event is dissipated through the plurality of tape structures, including the at least one non-superconductor tape structure.

The present embodiments provide multiple advantages over known fault current limiter systems. A first advantage is the increased energy capacity provided, while not modifying the trigger current. Another advantage provided is the allowance of higher critical current tapes, while at the same time lesser in number, with the accompanying cost reduction for achieving the same energy capacity and targeted transition current of a fault current limiter system. A further advantage is the increased flexibility to meet varying system design and cost requirements.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A superconducting fault current limiter element, comprising:
a plurality of tapes, arranged in electrical parallel fashion among one another, wherein at least one tape of the plurality of tapes comprises a superconductor tape, and wherein at least one tape of the plurality of tapes comprises a non-superconductor tape, and wherein the superconductor tape and the non-superconductor tape are not disposed in contact with one another.

2. The superconducting fault current limiter element of claim 1, wherein the plurality of tapes comprises four tapes, arranged in a stacked fashion, wherein a pair of outer tapes are superconductor tapes.

3. The superconducting fault current limiter element of claim 2, wherein a pair of inner tapes are non-superconductor tapes.

4. The superconducting fault current limiter element of claim 2, wherein a first inner tape of the plurality of tapes is a superconductor tape, and wherein a second inner tape of the plurality of tapes is a non-superconductor tape.

5. The superconducting fault current limiter element of claim 1, wherein the plurality of tapes are arranged one on top of another.

6. The superconducting fault current limiter element of claim 1, wherein a given tape of the plurality of tapes comprises a plurality of tape structures, arranged in electrical series with one another.

7. The superconducting fault current limiter element of claim 6, wherein a given tape structure of the plurality of tape structures comprises a base stainless steel layer and a top silver layer.

8. The superconducting fault current limiter element of claim 7, wherein the superconductor tape comprises a plurality of superconductor tape structures, wherein a given superconductor tape structure further comprises a superconductor layer, disposed between the top silver layer and the base stainless steel layer.

9. A superconducting fault current limiter system, comprising:
 a superconducting fault current limiter;
 an input conductor, coupled to the superconducting fault current limiter on a first side;
 an output conductor, coupled to the superconducting fault current limiter on a second side, and arranged in electrical series with the input conductor and the output conductor,
 wherein the superconducting fault current limiter comprises a plurality of superconducting fault current limiter elements, wherein a given superconducting fault current limiter element comprises:
  a plurality of tapes, arranged in electrical parallel fashion among one another, wherein at least one tape of the plurality of tapes comprises a superconductor tape, and wherein at least one tape of the plurality of tapes comprises a non-superconductor tape.

10. The superconducting fault current limiter system of claim 9, wherein the plurality of tapes comprises four tapes, arranged in a stacked fashion, wherein a pair of outer tapes are superconductor tapes.

11. The superconducting fault current limiter system of claim 10, wherein a pair of inner tapes are non-superconductor tapes.

12. The superconducting fault current limiter system of claim 10, wherein a first inner tape of the plurality of tapes is a superconductor tape, and wherein a second inner tape of the plurality of tapes is a non-superconductor tape.

13. The superconducting fault current limiter system of claim 9, wherein the plurality of tapes are arranged one on top of another.

14. The superconducting fault current limiter system of claim 9, wherein a given tape of the plurality of tapes comprises a plurality of tape structures, arranged in electrical series with one another.

15. The superconducting fault current limiter system of claim 14, wherein a given tape structure of the plurality of tape structures comprises a base stainless steel layer and a top silver layer.

16. The superconducting fault current limiter system of claim 15, wherein the superconductor tape comprises a plurality of superconductor tape structures, wherein a given superconductor tape structure further comprises a superconductor layer, disposed between the top silver layer and the base stainless steel layer.

17. A method, comprising:
 providing a superconducting fault current limiter, the superconducting fault current limiter comprising a plurality of tapes, including at least one non-superconductor tape and at least one superconductor tape;
 conducting a current through the superconducting fault current limiter a first current level, wherein the first current level is below a critical current for the at least one superconductor tape;
 limiting the current passing through the superconducting fault current limiter during a fault event, wherein the at least one superconductor tape becomes non-superconducting; and
 dissipating an energy of the fault event through the plurality of tapes, including the at least one non-superconductor tape.

18. The method of claim 17, wherein the plurality of tapes comprises at least four tapes, arranged in a stacked fashion, wherein a pair of outer tapes are superconductor tapes.

19. The method of claim 18, wherein a pair of inner tapes are non-superconductor tapes.

20. The method of claim 18, wherein a first inner tape of the plurality of tapes is a superconductor tape, and wherein a second inner tape of the plurality of tapes is a non-superconductor tape.

* * * * *